US008268733B2

(12) United States Patent
Tan et al.

(10) Patent No.: US 8,268,733 B2
(45) Date of Patent: Sep. 18, 2012

(54) LOCALIZED ANNEAL

(75) Inventors: Dexter Tan, Singapore (SG); Chee Chong Lim, Singapore (SG); Sai Hooi Yeong, Singapore (SG); Chee Mang Ng, Singapore (SG)

(73) Assignees: Nanyang Technological University, Singapore (SG); National University of Singapore, Singapore (SG); Globalfoundries Singapore Pte. Ltd., Singapore (SG)

( * ) Notice: Subject to any disclaimer, the term of this patent is extended or adjusted under 35 U.S.C. 154(b) by 554 days.

(21) Appl. No.: 12/537,268

(22) Filed: Aug. 7, 2009

(65) Prior Publication Data

US 2011/0034040 A1 Feb. 10, 2011

(51) Int. Cl.
*H01L 21/263* (2006.01)
(52) U.S. Cl. ............................... 438/795; 257/E21.333
(58) Field of Classification Search .................. 438/795; 257/E21.333
See application file for complete search history.

(56) References Cited

U.S. PATENT DOCUMENTS

| 6,905,983 | B2* | 6/2005 | Itani ............................... 438/795 |
| 7,432,187 | B1* | 10/2008 | Cok ............................... 438/609 |
| 2004/0180298 | A1* | 9/2004 | Stone et al. .................... 430/320 |
| 2007/0071882 | A1* | 3/2007 | Thomas et al. ................. 427/64 |
| 2009/0121157 | A1* | 5/2009 | Moffatt et al. ............. 250/492.2 |

OTHER PUBLICATIONS

Z. Nenyei et al., Defect-Guarded Rapid Thermal Processing, J. Electrochem. Soc., Jun. 1993, pp. 1728-1733, vol. 140, No. 6, The Electrochemical Society, Inc., Germany.
Woo Sik Yoo et al., Electrical activation of ultra-shallow B and BF2 implanted silicon by flash anneal, Nuclear Instruments and Methods in Physics Research B, Jul. 6, 2005, pp. 12-17, vol. 237 Issue 1-2, Wafer Masters, Inc., San Jose, USA.

* cited by examiner

*Primary Examiner* — Thao P. Le
(74) *Attorney, Agent, or Firm* — Horizon IP Pte Ltd

(57) ABSTRACT

A method of forming a device is presented. The method includes providing a wafer having an active surface and dividing the wafer into a plurality of portions. The wafer is selectively processed by localized heating of a first of the plurality of portions. The wafer is then repeatedly selectively processed by localized heating of a next of the plurality of portions until all plurality of portions have been selectively processed.

20 Claims, 9 Drawing Sheets

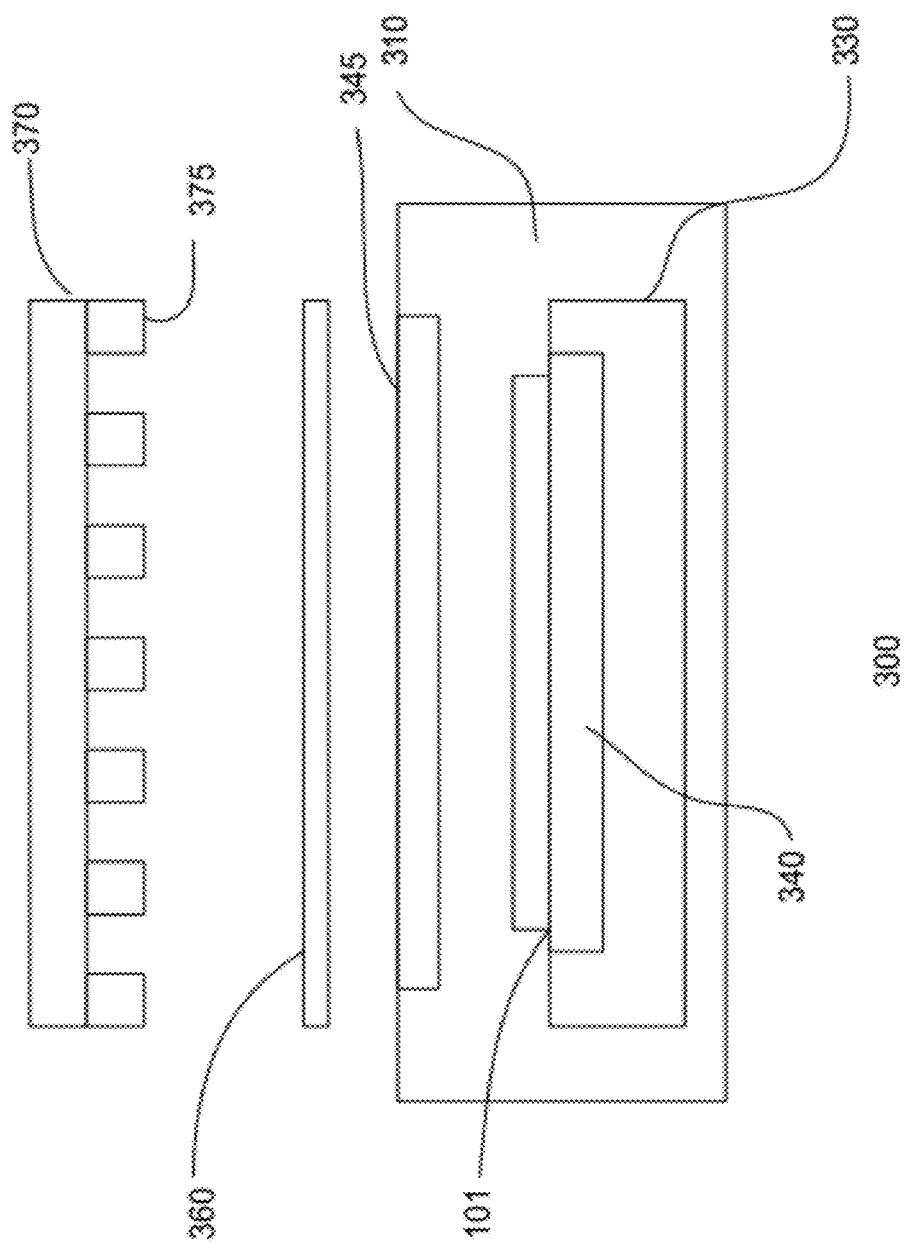

LOCALIZED ANNEAL

BACKGROUND

The continual scaling of semiconductor devices in recent years has driven the improvement of large scale integrated circuit (LSI) performance to a great extent. This is achieved by increasing the integrated density, that is, by miniaturizing the components such as transistors that build up the semiconductor devices. As a result, source/drain regions comprising shallow junctions with low resistance have become significant in reducing short channel effects which are brought about by the miniaturization of the components.

To form the shallow junction or shallow impurity diffusion layer, rapid thermal anneal (RTA) had been widely employed in the semiconductor fabrication industry. Impurity ions are implanted in a semiconductor substrate and are activated by annealing at a high temperature typically using a halogen lamp in a matter of seconds.

Nevertheless, the rapid decrease in the dimension of the semiconductor devices has demanded the formation of ultra shallow junctions which require better control of diffusion without compromising the activation rate of the impurities. Recently, anneals with even lower thermal budgets, such as a flash lamp anneal (FLA) at high temperatures in a duration of milliseconds, have been developed to meet the demand. The flash lamp is a gas discharge light source producing pulsed instantaneous radiation. Typically, one or more noble gases like xenon (Xe) or krypton (Kr) are filled in the bulb. The capacitor of the lamp which stores electrical charges can instantaneously discharge to emit a high intensity light within a few hundred μs to a few hundred ms.

FLA, however, which utilizes high irradiation energy for uniform activation of impurities, would result in a sudden temperature increase on the semiconductor substrate. The temperature difference in between a top surface and a bottom surface across the large substrate area could raise the amount of thermal stress which could result in the deformation of the substrate like wafer warpage and even wafer breakage.

SUMMARY

A method of forming a device is presented. The method includes providing a wafer having an active surface and dividing the wafer into a plurality of portions. The wafer is selectively processed by localized heating of a first of the plurality of portions. The wafer is then repeatedly selectively processed by localized heating of a next of the plurality of portions until all plurality of portions have been selectively processed.

In another embodiment, a method of fabricating an article is disclosed. The method includes providing an article having an active surface and the article is divided into a plurality of portions. The article is selectively processed the article by localized processing of a first of the plurality of portions. The article is then repeatedly selectively processing the article by localized heating of a next of the plurality of portions until all plurality of portions have been selectively processed.

In yet another embodiment, a semiconductor processing system is presented. The system includes a stage for mounting a substrate to be processed. It also includes means for dividing the substrate into a plurality of portions. Means for selectively processing the article by localized processing of a first of the plurality of portions is also included. Means for repeatedly selectively processing the article by localized heating of a next of the plurality of portions until all plurality of portions have been selectively processed is also disclosed as well.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 3 shows an embodiment of a processing system.

DETAILED DESCRIPTION

Embodiments generally relate to processing or processing systems. Embodiments can be employed, for example, for forming semiconductor devices or integrated circuits (ICs). Various types of devices can be formed, for example dynamic or static random access memories, signal processors, or system-on-chip devices. The devices can be incorporated into, for example, consumer electronic products, such as computers, cell phones, and personal digital assistants (PDAs). Embodiments may also be applied to other industries of applications.

Figure 1:
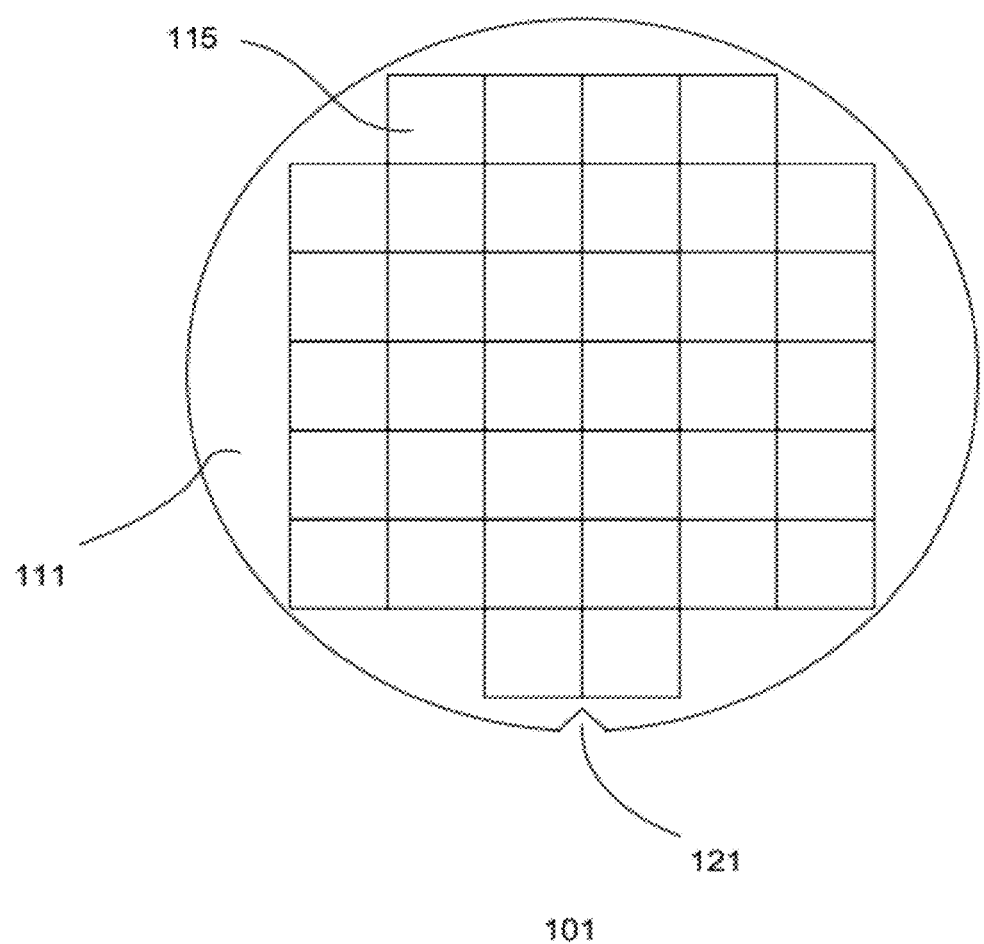
FIG. 1 shows a wafer.

FIG. 1 shows a semiconductor wafer 101. The semiconductor wafer, for example, comprises silicon. Other types of wafers are also useful. For example, the wafer may be a p-type, n-type, silicon-on-insulator or silicon germanium wafer. Depending on the type of device, the wafer may comprise a non-semiconductor material. The wafer may include a notch 121 to indicate the crystal orientation of the wafer. Other techniques for indicating the crystal orientation may also be useful. Additional indicators may also be included to indicate the dopant type of the wafer.

The wafer includes an active surface 111 on which devices 115 are formed. A plurality of devices may be formed on the wafer in parallel. The devices are subsequently singulated into individual dies, assembled and tested. In other embodiments, the wafer may comprise a single device.

The fabrication of devices, such as integrated circuits (ICs), involves the formation of features on a substrate that make up circuit components, such as transistors, resistors and capacitors. The devices are interconnected, enabling the device to perform the desired functions. Interconnections are formed by forming contacts and conductive lines in a dielectric layer using, for example, damascene techniques. Devices may comprise a plurality of interconnect levels.

Figure 2:
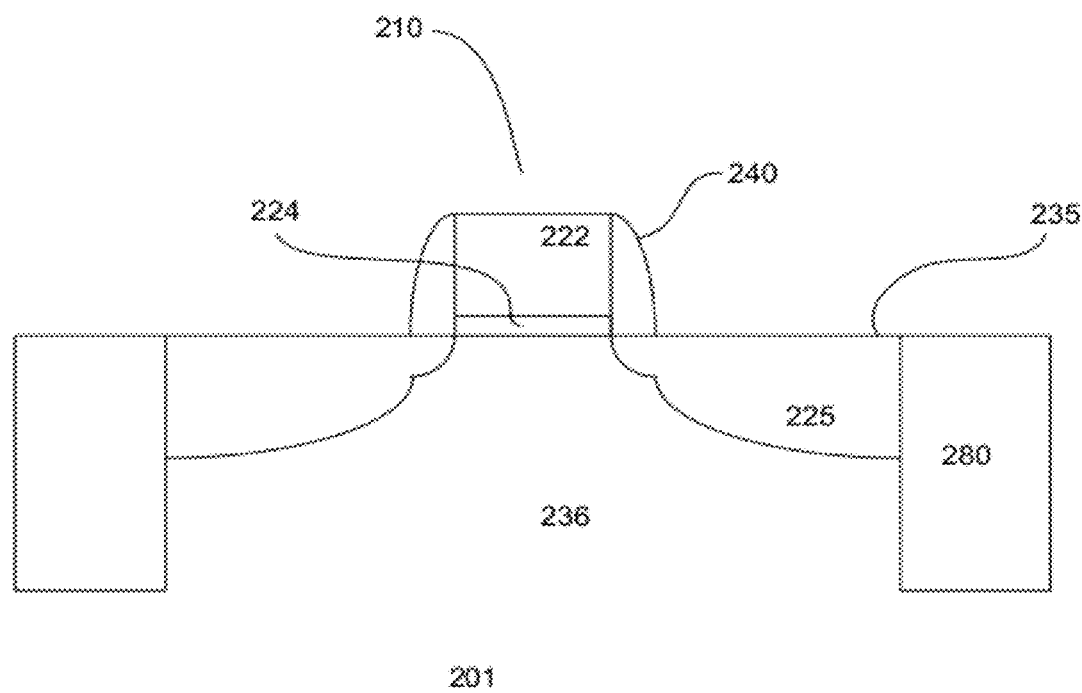
FIG. 2 shows a portion of a device formed on a wafer.

FIG. 2 shows a portion 201 of a device formed on a wafer. The device comprises an active region in which a transistor 210 is formed. Isolating the active region from other regions are isolation regions 280, for example, shallow trench isolation (STI) regions. The transistor includes a gate. The gate, for example, includes a gate electrode 222 over a gate dielectric layer 224. Sidewall spacers 240 are provided on sidewalls of the gate. Source/drain diffusion regions 225 are disposed in the active region adjacent to the gate. The source/drain diffusion regions may include extension regions beneath the spacers.

FIG. 3 shows a simplified diagram of an embodiment of a processing system 300. The processing system is an annealing system. In one embodiment, the processing system comprises a flash lamp annealing (FLA) system. The processing system is particularly useful for high temperature ultra-short annealing applications. Such processing system may be employed to, for example, anneal a substrate prepared with doped regions, such as source/drain regions of a transistor, as depicted in FIG. 2, for dopant activation. The processing system may also be employed for other purposes.

As shown, the processing system comprises, for example, a processing chamber 310. The processing chamber, in one embodiment, comprises a vacuum chamber. The processing chamber includes a stage or chuck 330 which holds an article 101 to be processed. In one embodiment, the article to be processed comprises a semiconductor wafer. Processing other types of articles may also be useful. The chuck, for example, holds the wafer in place by electrostatic force or vacuum pressure. Other types of chucks are also useful.

The stage includes a backside heating source 340. In one embodiment, the backside heating source comprises a lamp assembly for heating the backside of the wafer. The lamp assembly, for example, comprises a plurality of lamps, such as tungsten lamps or halogen lamps. Other types of backside heating sources, including hotplates, are also useful. The backside heating source can also include a combination of different types of heating components, such as lamps and hotplates. The backside heating source is configured to pre-heat the wafer. Pre-heating of the wafer enhances the uniformity of heat distribution across the wafer.

The chamber may also include inlets for supplying gases to the chamber during processing. For example, inert gases such as nitrogen ($N_2$) and argon (Ar), may be supplied to the chamber during processing of the wafer.

In one embodiment, a transparent window 345 is disposed on the top of the processing chamber. The transparent window comprises, for example, quartz. The transparent window enables energy from an excitation source 370 disposed outside of the chamber to process the active or front surface of the wafer. Other types of transparent materials which can maintain the vacuum of the processing chamber and allow passage of energy from the excitation source are also useful. For some embodiments, the excitation source may be disposed within the processing chamber. In such applications, the transparent window may not be needed.

The excitation source, in one embodiment, comprises a heating source. Various types of heating sources may be employed. In one embodiment, the heating source comprises a heat lamp assembly. Other types of heating sources may also be useful. The heat lamp assembly, for example, comprises a plurality of flash lamps 375. In one embodiment, the flash lamps comprise xenon or krypton flash lamps. Other types of flash lamps are also useful. The flash lamps generate pulsed light energy with intense heat for short durations. For example, the energy density of the flash lamps can be about 15-40 J/cm$^2$ with a pulse width at full width at half maximum (FWHM) of the pulse at about 0.1-100 ms. Other energy densities and pulse widths are also useful. An excitation source controller (not shown) can be provided to control the excitation source to produce the desired energy densities and pulse widths. The excitation source can be controlled to heat the wafer to a temperature of about 900-1500° C. within milliseconds. Providing an excitation source for heating the wafer to other processing temperatures and/or at other ramp rates is also useful.

A lamp of the lamp assembly directs the light energy to the wafer. The light energy of a lamp covers a heating zone. The size of the heating zone which a lamp covers depends on, for example, the lamp design. Lamps of the lamp assembly can be circular, oval or tube shaped to produce circular, oval, or elongated heating zone shapes. It is understood that a lamp assembly can comprise lamps of the same shape or different shapes. The lamps of the lamp assembly are configured to process the whole wafer. In one embodiment, the lamps are configured such that the respective heating zones of the lamps process the whole surface of the wafer. Preferably, the lamps are configured such that the respective heating zones of the lamps properly process the whole surface of the wafer.

Figure 4A:
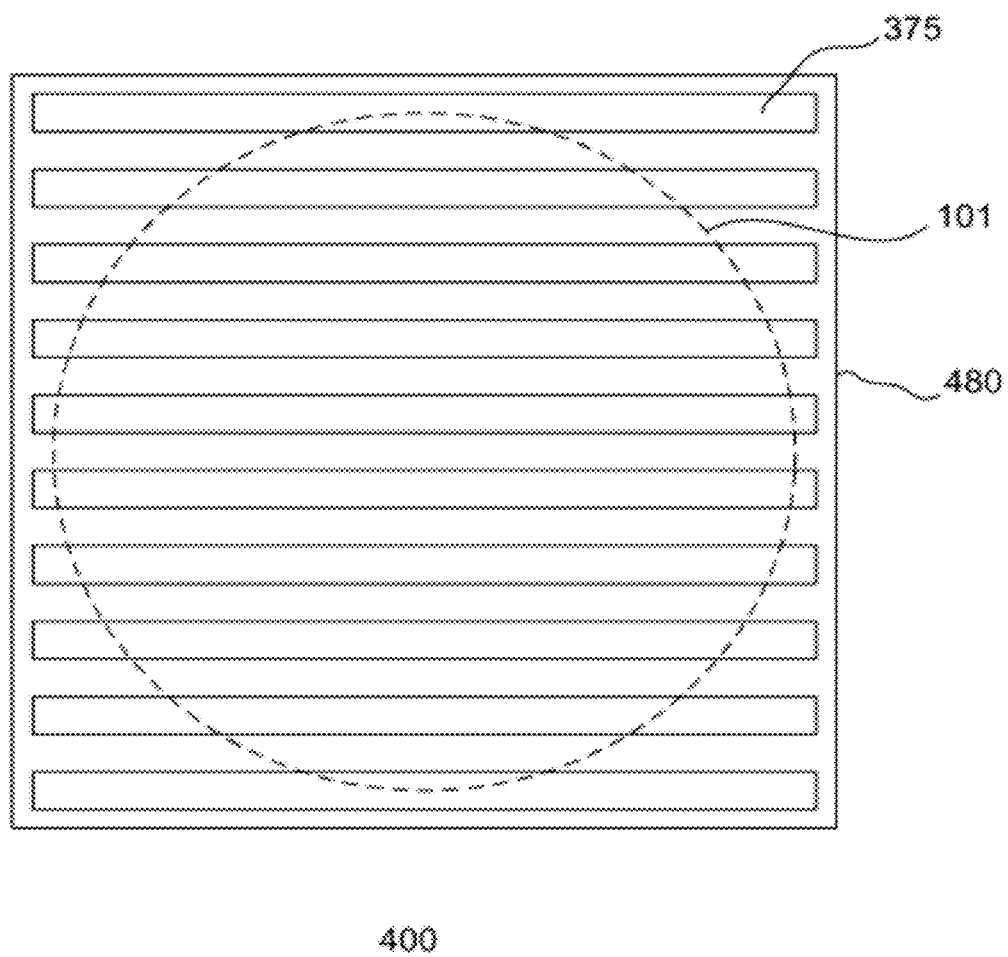
FIGS. 4a-b show embodiments of lamp assemblies.
Figure 4B:
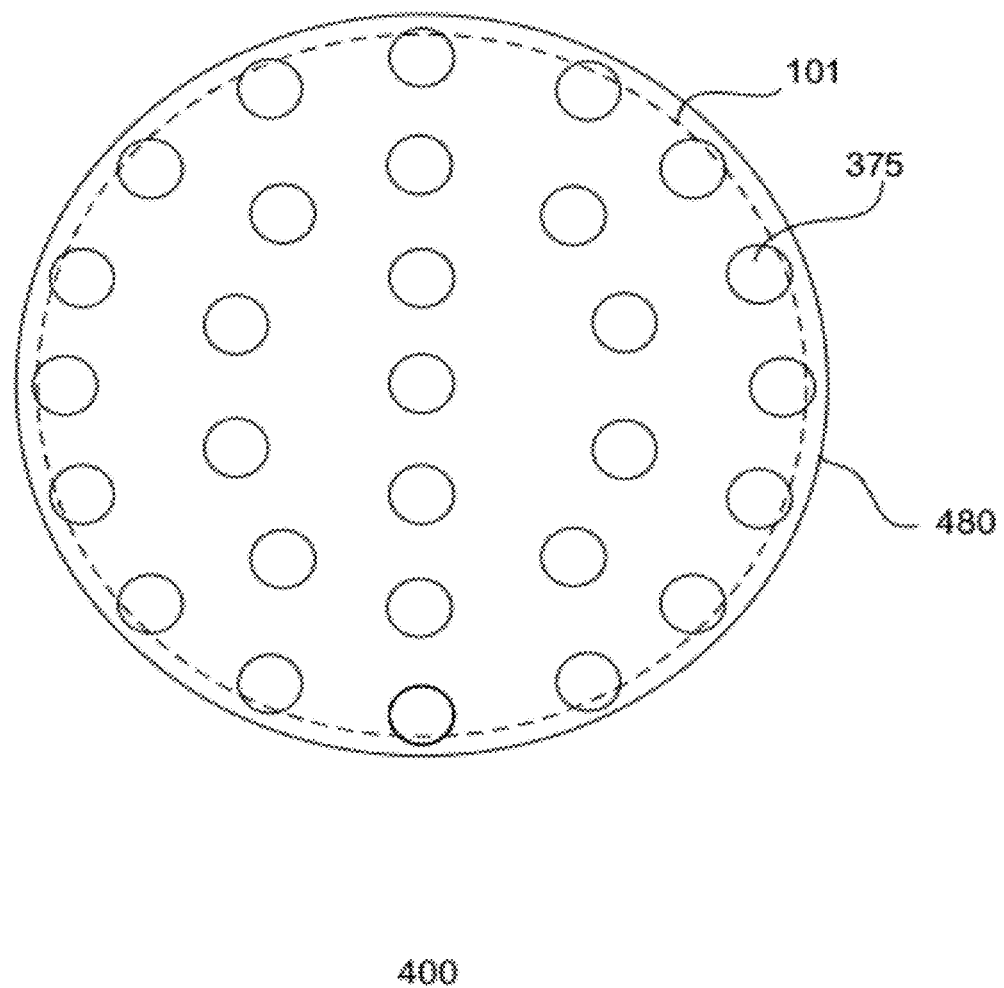

FIGS. 4a-b show different embodiments of a lamp assembly 400. Referring to FIG. 4a, the lamp assembly comprises an assembly base 480 on which a plurality of lamp bulbs 375 are mounted. In one embodiment, the lamp bulbs comprise tubular shaped bulbs arranged in rows. The lamp bulbs are configured to process a wafer 101, as indicated by the dotted line. As shown, the lamp bulbs comprise tubular shaped bulbs of the same length and extend across the width of the wafer. Providing bulbs of different lengths in each row may also be useful. In other embodiments, more than one bulb can be provided for a row. Other configurations of bulbs may also be useful.

In FIG. 4b, the lamp assembly comprises a plurality of circular shaped bulbs 375 mounted on the assembly base 480. The lamp bulbs are configured to process a wafer 101, as indicated by the dotted line. Alternatively, the bulbs can comprise different shapes. For example, the bulbs can be a combination of circular, oval and/or tubular shaped bulbs. Other configurations of bulbs are also useful.

In one embodiment, the lamp assembly processes the active surface of the wafer using multiple exposures. For example, N numbers of exposures are used to process the active surface of the wafer, where N is a whole number greater than or equal to 2. In other embodiments, N is equal to 3. Providing other values of N is also useful. Keep in mind that the greater the value of N, the longer the processing time. Preferably, the number of exposures or N should not adversely affect or significantly affect the throughput of the overall process.

The wafer, in one embodiment, is sub-divided into n plurality of processing zones. An exposure selectively processes its respective processing zone. For example, the light energy from the exposure locally heats a processing zone. In one embodiment, an $x^{th}$ exposure exposes a respective $x^{th}$ processing zone, where x is a whole number from 1 to N. To complete processing of the wafer, N exposures are employed.

In one embodiment, a processsing zone comprises an area which is equal to about 1/N the total area of the wafer. Preferably, a processing zone comprises a group of sub-processing zones in which the total area of the sub-processing zones are equal to about 1/N the total area of the wafer. The sub-processing zones preferably are disbursed evenly or substantially evenly within the active surface of the wafer. For example, the sub-processing zones are disbursed an equidistance or substantially equidistance apart within the active surface of the wafer. The sub-processing zones may be configured to be partially contiguous, distinct or a combination thereof. Providing other configurations of processing zones or sub-processing zones is also useful. For example, a processing zone may not necessary be 1/N the total area. In such cases, one or more of the processing zones may have a total area that is greater than 1/N, less than 1/N, equal to 1/N or a combination thereof.

In one embodiment, the number of exposures and configurations of zones or sub-processing zones are selected to reduce thermal stress on the wafer which may result in wafer deformation. In the case where the processing of the wafer is divided into N exposures, each exposure preferably processes about 1/N the total area of the wafer. Providing exposures which process processing zones having a total area other than 1/N or a combination of a total area equal to 1/N and not equal to 1/N is also useful.

A processing zone, in accordance with one embodiment, is exposed once by the excitation source. The exposed processing zone remains unexposed during exposures of other processing zones. For example, the exposed processing zone can be protected from the light energy during exposure of other processing zones. Other techniques for selectively exposing a processing zone on the wafer are also useful.

Furthermore, by configuring the sub-processing zones of an exposure to heat localized portions of the substrate, stress build-up which can cause wafer deformation or damage is reduced or prevented. Preferably, the localized portions are spaced apart sufficiently to reduce stress build-up which can cause deformation or damage. Note that with smaller zones (e.g., sub-processing zones), lower amount of stress will build up. Conversely, with larger zones, a higher amount of stress will build up. However, smaller zones may require more exposures, which will increase processing time required to process the wafer. Preferably, the zones and number of exposures are selected to result in processing of the wafer without incurring stress damage, such as cracking or breakage of the wafer, while avoiding aversely affecting the throughput of the overall processing of the wafer. For example, N can be about 3. Providing other values which are larger or less is also useful, and may depend on applications.

Figure 5:
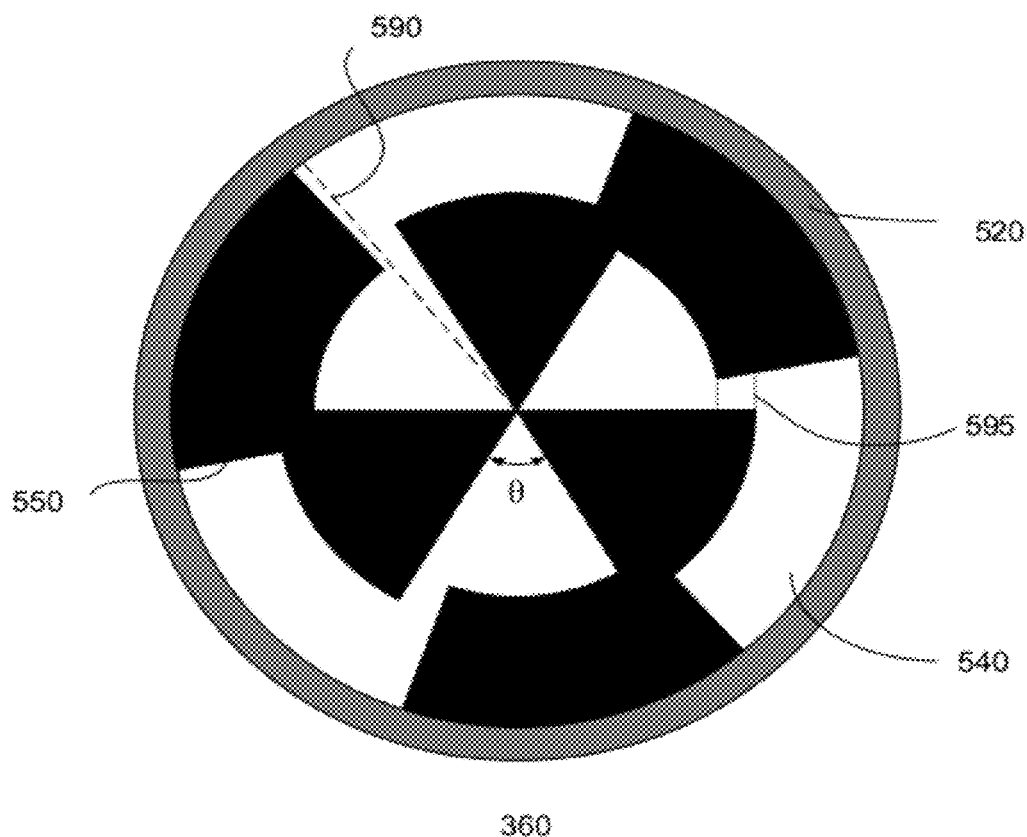
FIG. 5 shows an embodiment of an excitation mask.

In one embodiment, an excitation mask 360 as illustrated in FIG. 5 is provided in the processing system to facilitate localized processing of zones of the wafer. The excitation mask is disposed between the excitation source and the wafer which is disposed on the chuck. In one embodiment, the excitation mask is disposed between the excitation source and the transparent window of the processing chamber. Disposing the excitation mask at other locations between the excitation source and wafer is also useful. For example, the mask may be disposed within the processing chamber.

In one embodiment, the mask comprises opaque and transparent regions, wherein the opaque region or regions block transmission of light energy from the excitation source while the transparent region or regions allow light energy from the excitation source to be transmitted, thereby selectively processing regions on the surface of the wafer corresponding to the transparent regions on the mask.

In one embodiment, the mask comprises alternating opaque and transparent portions. The transparent portion or portions, for example, can be referred to as mask processing regions while the opaque portion or portions can be referred to as mask non-processing portions. The mask processing portion corresponds to the processing zone on the wafer for processing; the mask non-processing portion corresponds to the non-processing zone on the wafer. In one embodiment, the transparent portions correspond to sub-processing zones of a processing zone on the wafer for processing. The area of the mask processing portion is, for example, equal to about 1/N the area of the wafer, where N is the number of exposures to complete processing of the wafer. The remaining portion of the mask (e.g., total area of the remaining portion of the mask is about 1-1/N total area of the wafer) comprises opaque portions or mask non-processing portions.

The excitation mask is designed to process the whole active surface of the wafer by repositioning the mask processing region with respect to the wafer. Repositioning of the mask processing region, in one embodiment, can be achieved by rotating the mask, the chuck, or a combination of both. For example, the mask can be mounted on a rotatable support frame, the wafer can be mounted on a rotatable chuck or a combination of both. Other techniques for repositioning the processing zone are also useful.

In one embodiment, repositioning of the mask processing portion with respect to the wafer can be achieved as a stepped function. One or more of the rotatable components, such as the mask, chuck or a combination thereof, can be rotated into position for exposure to light energy from excitation source. After exposure pulse terminates, the rotatable component or components are repositioned for the next exposure. The repositioning of the components and exposure are repeated until processing of the wafer is completed.

To provide a margin of error due to positioning misalignment to increase the processing window, the area of the mask processing region can be selected to be slightly greater than 1/N total area of the wafer. Where sub-processing portions of the mask are employed, they can be designed and provided with a slightly greater size to increase the processing window.

Alternatively, the repositioning of the mask processing portion with respect to the wafer can be achieved as a continuous function. In the case of a continuous function, one or more of the rotatable components, such as the mask, chuck or a combination thereof, can be continuously rotated during exposure to light energy from the excitation source. The speed of the continuous rotation is selected to ensure the processing zones are exposed to a sufficient amount of energy from the excitation source for processing. Where both the mask and chuck are rotated, they are rotated in opposite directions.

The rotatable component or components are rotated by a sufficient amount to completely process the substrate. For example, the amount of rotation is about 360° for a single rotatable component and about 180° for two rotatable components. Rotating the components by other amounts is also useful. For example, the rotatable components can be rotated by a multiple of 180° or 360°, depending on the application. Depending on the speed of rotation and pulse duration, the wafer may or may not be completely processed within one pulse of the excitation source. In the case where more than one energy pulse is employed to complete processing of the wafer, the rotation of the components stops when the pulse terminates and resumes with the next pulse.

FIG. 5 shows an embodiment of an excitation mask 360. The mask comprises transparent portions 540 and opaque portions 550. The mask, for example, may be mounted on a rotating platform or support 520. Alternatively, the support may be a fixed or non-rotatable support. The transparent portions represent a mask processing portion of the mask. In one embodiment, the mask processing portion comprises a plurality of transparent sub-portions $540_{1-T}$ or mask processing sub-portions, where T is the number of mask processing sub-portions. As shown, the mask comprises three mask processing sub-portions $540_{1-3}$ (e.g., T=3). Providing masks with other numbers of mask processing sub-portions is also useful.

The mask sub-portions, for example, extend from the center of the mask to the circumference. For example, the sides of the mask sub-portions form radii 590 of the mask. In one embodiment, the mask processing sub-portions comprise an angle θ. The magnitude of θ, in one embodiment, is greater than 0° and less than 180°. Preferably, the magnitude of θ is divisible into 360°. Preferably, each mask processing sub-portion comprises the same angle θ. Other configurations of processing sub-portions are also useful. For example, mask processing sub-portions of different angles may also be employed.

In one embodiment, n, the number of mask non-processing sub-portions separating the mask processing sub-portions is equal to T, wherein n=T. Preferably, the value T is divisible into 360°. As shown, three mask non-processing sub-portions (e.g., n=T=3) are provided. The mask non-processing sub-portions comprise an angle $\theta_n$. Preferably, the angle $\theta_n$ of each mask non-processing sub-portion is the same.

In one embodiment, the internal sub-portions of the excitation mask can be designed according to the following equation:

$$n = \frac{360°}{N} \times \frac{1}{\theta} \quad \text{(equation 1)}$$

where,
n=the number of internal non-processing or opaque sub-portions;
N=the number of exposures to complete processing of the wafer; and
θ=the angle of the processing sub-portions.

By selecting or knowing two of the 3 variables in equation 1, the third can be determined. For example, if θ=60° and N=2, then:

$$n = \frac{360°}{2} \times \frac{1}{60} \rightarrow n = 3$$

As such, the number of internal non-processing or opaque sub-portions equals 3. In one embodiment, the angle $\theta_n$ of each non-processing sub-portion is equal to:

$$\theta_n = \frac{360°}{N} - \theta \quad \text{(equation 2)}$$

This would result in $\theta_n$ being equal to 60°. In another example, if n=3 and N=3, then θ would equal to 40° (from equation 1) and $\theta_n$ would equal to 80° (from equation 2).

In one embodiment, the processing sub-portions of the mask each comprises multiple sections. For example, as shown, the processing sub-portions comprise first (inner) and second (outer) sections. Providing processing sub-portions having more than two sections is also useful. As shown, the edges of the sections comprise arcs. For example, the edge of the inner section and edge of the outer section comprise complementary arcs. The edges of the sections, in one embodiment, overlap. The overlapping of the edges of the sections can ensure complete processing of the wafer surface.

Furthermore, in one embodiment, the inner and outer sections are shifted with respect to each other. The shifting of the sections should preferably result in the sides of the sections being misaligned, resulting in a slit spacing 595 to ensure that no portions of the wafer are unexposed. Providing a mask wherein the inner and outer sections do not form a slit may also be useful. Other configurations of sub-portions are also useful.

Figure 6A:
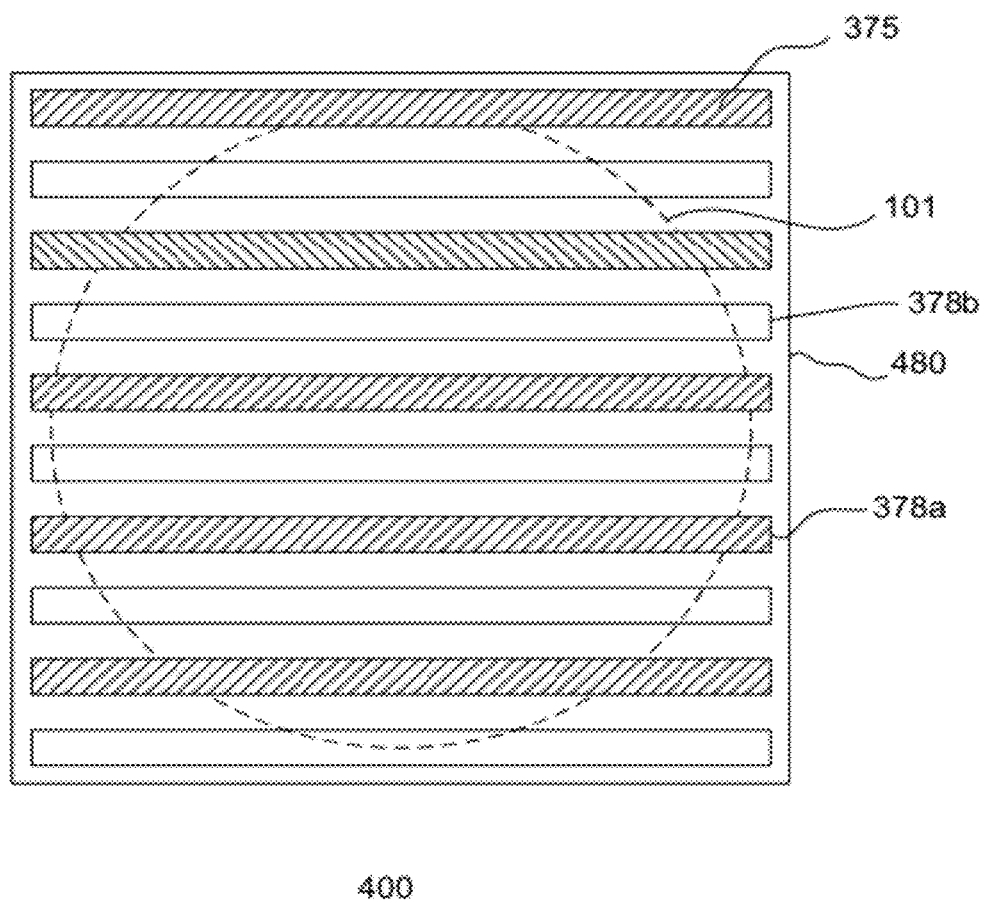
FIGS. 6a-b show embodiments of lamp assemblies.
Figure 6B:
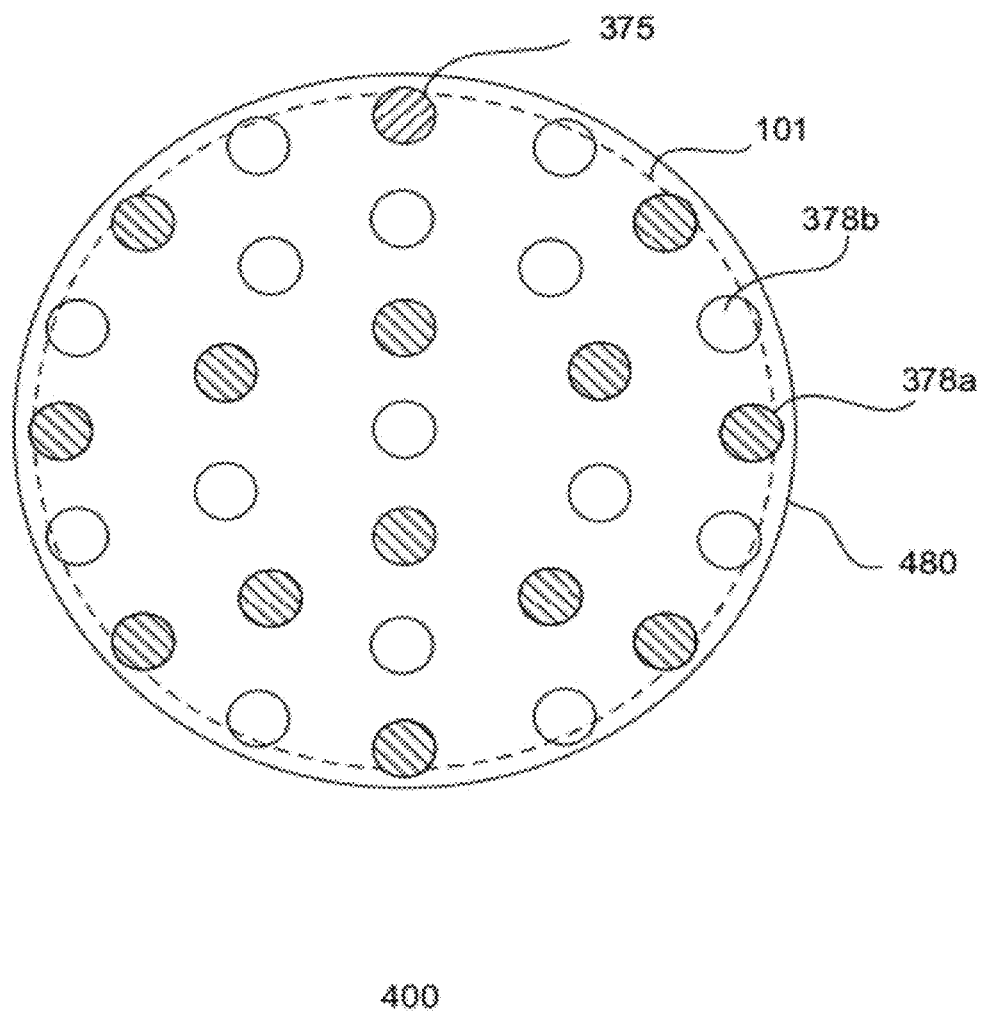

FIGS. 6a-b show embodiments of lamp assemblies 400, similar to that of FIGS. 4a-b. FIG. 6a shows a lamp assembly with tubular shaped bulbs 375 while FIG. 6b shows a lamp assembly with circular shaped bulbs 375. Lamp assemblies with other shaped bulbs or a combination of different shaped or sized bulbs may also be useful. The operation of the bulbs is controlled by, for example, a lamp controller which is part of the processing system. In one embodiment, the lamp assembly is controlled to process the active surface of the wafer using N exposures, wherein an exposure selectively processes localized regions on the wafer.

The bulbs of the lamp assembly are divided into a plurality of groups. In one embodiment, the number of groups is equal to N exposures to process the wafer. As shown, the bulbs of the lamp assembly are divided into first and second groups 378a-b (e.g., N=2). Dividing the bulbs into other numbers of groups is also useful.

In one embodiment, the bulbs within a group process a processing zone on the wafer. A processing zone, for example, is about 1/N the total area of the wafer. Having processing zones of other sizes is also useful. Furthermore, the processing zones of the N exposures need not be of the same size. For example, a processing zone may cover a total area other than 1/N or a combination of a total area other than 1/N and equal to 1/N.

Preferably, a processing zone comprises a plurality of sub-processing zones. The sub-processing zones are distributed across the wafer surface. Preferably, the sub-processing zones are evenly distributed across the wafer. For example, the sub-processing zones are equally or substantially equally spaced apart. Providing sub-processing zones which are not equally or not substantially equally spaced apart may also be useful. Heating the wafer at localized processing zones or sub-processing zones avoids stress build-up and reduces or prevents stress damage, such as warpage or breakage.

The controller, for example, is programmed to activate the first group of bulbs during the first exposure. The second group of bulbs is activated to initiate the second exposure when the first exposure terminates. For assemblies with N groups, the controller controls the activation of bulbs to produce N exposures to complete processing of the wafer.

Figure 7:
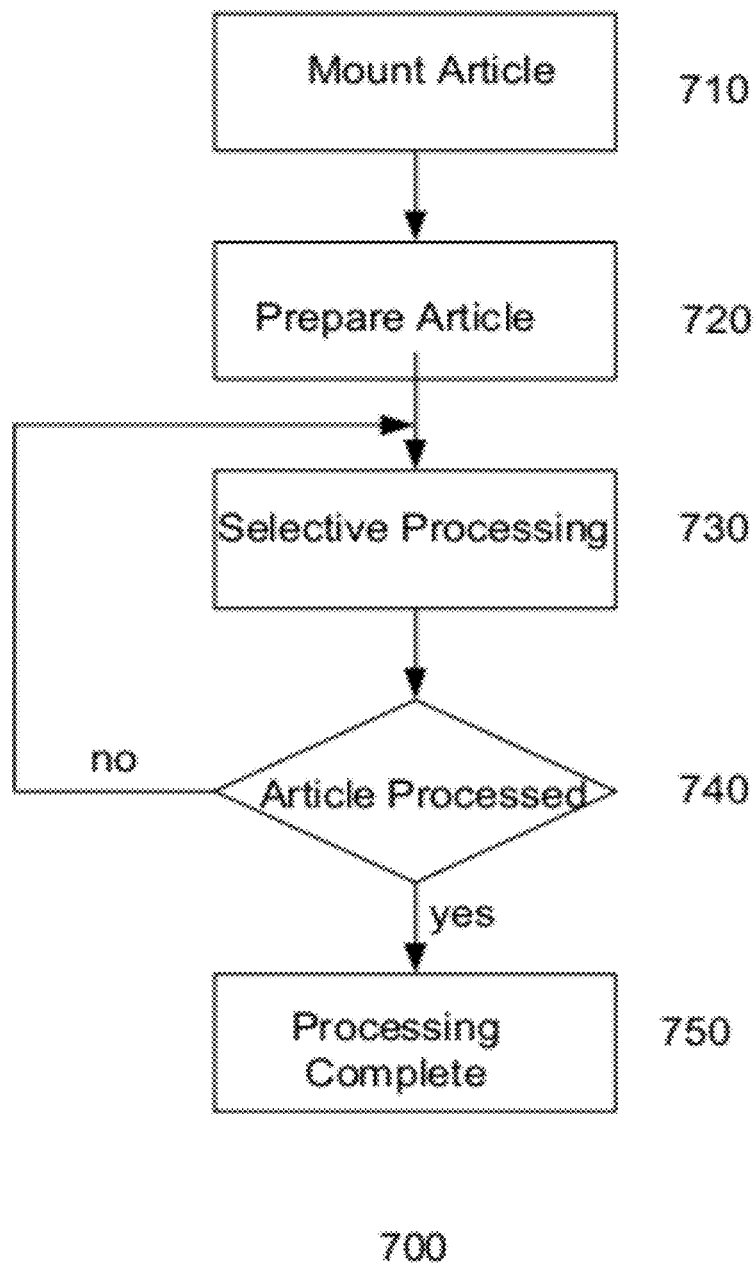
FIG. 7 shows an embodiment of a flow diagram for processing an article.

FIG. 7 shows a flow diagram 700 for processing an article. At step 710, an article is inserted into the processing chamber of a processing system. The processing system, for example, comprises an FLA processing system, such as that described in FIG. 3. Other types of processing system may also be useful. In one embodiment, the article comprises a wafer, such as that described in FIG. 1. The wafer, in one embodiment, is at the stage of processing in which dopants are activated through annealing. The wafer may also be at other stages of processing. A chuck is employed to hold the wafer in the processing chamber. Holding the wafer in place may be achieved using vacuum pressure. Other techniques for holding the wafer in place may also be useful.

The wafer is prepared for processing at step 720. In one embodiment, the wafer is prepared by pre-heating the wafer with the backside heating source. The wafer, for example, can be pre-heated to an intermediate temperature of about, for example, 300-600° C. Other intermediate temperatures may also be useful. For example, the wafer can be pre-heated to a temperature of about 300-900° C. In one embodiment, the wafer is pre-heated to a temperature of about 500° C. Pre-heating of the wafer helps to minimize the temperature difference between the surface and base of the wafer, reducing the risk of wafer warpage.

In one embodiment, the wafer is prepared in an inert ambient, such as $N_2$ or Ar. This is to avoid incorporation of any foreign gas or substance into the wafer during high temperature process.

After the wafer is prepared, the active surface of the wafer is selectively processed at step 730. In one embodiment, the selective processing comprises exposing the localized region or regions on the wafer surface with an excitation source. The excitation source, for example, comprises flash lamps which produce a short-time pulse of intense light. The process temperature can reach a range of about 900-1500° C. within milliseconds. The gas fill pressures may range from about a few kPa to hundreds of kPa. For example, the gas fill pressures can be about 0.01-4 atm. Generally, the higher the pressure, the greater the output efficiency.

Selective processing at step 730 can be achieved using an excitation or annealing mask, as described in FIG. 5. Alternatively, selective processing may be achieved by activating a sub-group of bulbs on the lamp assembly, as described in FIGS. 6*a-b*. Other techniques for selective processing may also be useful.

In one embodiment, the wafer is selectively processed by N exposures of light energy from the FLA processing system to completely process the whole wafer. In one embodiment, N exposures process N plurality of regions on the wafer, with one exposure processing one respective region on the wafer. A region may include a plurality of sub-regions. After a first of the plurality of regions are processed by the first exposure (x=1), the system determines if there are more regions to be selectively processed at step 740. If it is determined that there are additional regions to be selectively processed, the process returns to step 730 for the next exposure (x=x+1). This continues until all regions have been selectively processed (x=N). The process terminates at step 750 when all regions have been processed.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a wafer having an active surface;
dividing the wafer into a plurality of portions;
providing a mask between an excitation source and the wafer, the mask having opaque and transparent regions, wherein the opaque region(s) of the mask comprises non-processing sub-portions and the transparent region(s) of the mask comprise processing sub-portions, wherein the sub-portions extend from the center of the mask to the circumference;
selectively processing the wafer by localized heating of a first of the plurality of portions; and
repeatedly selectively processing the wafer by localized heating of a next of the plurality of portions until all plurality of portions have been selectively processed.

2. The method of claim 1 wherein processing the wafer comprises exposing the wafer to an excitation source N times, wherein each exposure processes substantially 1/N the total area of the wafer.

3. The method of claim 2 wherein the portions of the wafer is further divided into sub-portions, wherein the sub-portions are disbursed substantially evenly within the active surface of the wafer.

4. The method of claim 3 wherein the mask facilitates the localized heating of portions of the wafer.

5. The method of claim 4 wherein the opaque region(s) block transmission of light energy from the excitation source while the transparent region(s) allow light energy from the excitation source to be transmitted.

6. The method of claim 5 wherein the mask comprises alternating opaque and transparent regions.

7. The method of claim 5 further comprises repositioning the mask with respect to the wafer to process different portions of the wafer after the exposure of each portion to the excitation source.

8. The method of claim 7 wherein the repositioning of the mask with respect to the wafer comprises rotation of the mask or the chuck, or rotations of the mask and chuck in opposite directions.

9. A method of forming a device comprising:
providing a wafer having an active surface;
dividing the wafer into a plurality of portions;
selectively processing the wafer by localized heating of a first of the plurality of portions;
repeatedly selectively processing the wafer by localized heating of a next of the plurality of portions until all plurality of portions have been selectively processed; wherein processing the wafer comprises exposing the wafer to an excitation source N times, each exposure processes substantially 1/N the total area of the wafer; and wherein the portions of the wafer is further divided into sub-portions, the sub-portions are disbursed substantially evenly within the active surface of the wafer;
providing a mask between the excitation source and the wafer, wherein the mask facilitates the localized heating of portions of the wafer and comprises opaque and transparent regions, wherein the opaque region(s) block transmission of light energy from the excitation source while the transparent region(s) allow light energy from the excitation source to be transmitted; and
repositioning the mask with respect to the wafer to process different portions of the wafer after the exposure of each portion to the excitation source, wherein the repositioning of the mask with respect to the wafer comprises rotation of the mask or the chuck, or rotations of the mask and chuck in opposite directions, wherein the opaque region(s) of the mask comprises non-processing sub-portions and the transparent region(s) of the mask comprise processing sub-portions, wherein the sub-portions extend from the center of the mask to the circumference.

10. The method of claim 9 wherein the number of the mask non-processing sub-portions, n is obtained by $$n = \frac{360°}{N} \times \frac{1}{\theta},$$

wherein θ is the angle of the mask process sub-portions.

11. The method of claim 10 wherein the angle of the mask non-processing sub-portions, $\theta_n$ is obtained by $$\theta_n = \frac{360°}{N} - \theta.$$

12. The method of claim 9 wherein the mask processing sub-portion comprises a plurality of sections, wherein the sections overlap to ensure complete processing of the wafer.

13. The method of claim 12 wherein the sections of the mask processing sub-portions rotate in opposite directions after each exposure to the excitation source to form the overlap.

14. The method of claim 2 wherein the excitation source comprises a plurality of flash lamps with tubular shaped bulbs of the same length which extends across the width of the wafer.

15. The method of claim 2 wherein the excitation source comprises a plurality of groups of lamps, wherein the number of the groups is equal to N exposures to process the wafer.

16. The method of claim 15 wherein the lamps in each group are substantially uniformly distributed over the area corresponding to the surface of the wafer.

17. The method of claim 1 further comprises a pre-heating of the wafer by a back-side heating source.

18. The method of claim 17 wherein the processing of the wafer comprises flash lamp annealing.

19. The method of claim 2 wherein the excitation source comprises a plurality of flash lamps with a combination of circular, oval, and/or tubular, shaped bulbs.

20. A semiconductor processing system comprising:
a stage for mounting a substrate to be processed;
a divider for dividing the substrate into a plurality of portions; and
a mask having opaque and transparent regions for selectively processing the article by localized processing of a first of the plurality of portions,
followed by repeated selective processing of the article by localized heating of a next of the plurality of portions until all plurality of portions have been selectively processed; wherein the opaque region(s) of the mask comprises non-processing sub-portions and the transparent region(s) of the mask comprise processing sub-portions, wherein the sub-portions extend from the center of the mask to the circumference.

* * * * *